US007316941B1

United States Patent
Gupta

(10) Patent No.: US 7,316,941 B1
(45) Date of Patent: Jan. 8, 2008

(54) SEMICONDUCTOR DEVICE WITH A MOSFET FORMED IN CLOSE PROXIMITY TO A BIPOLAR DEVICE AND METHOD OF MANUFACTURE

(75) Inventor: Rajesh Gupta, Mountain View, CA (US)

(73) Assignee: T-RAM Semiconductor, Inc., Milpitas, CA (US)

( * ) Notice: Subject to any disclaimer, the term of this patent is extended or adjusted under 35 U.S.C. 154(b) by 227 days.

(21) Appl. No.: 11/190,242

(22) Filed: Jul. 26, 2005

(51) Int. Cl.
*H01L 21/332* (2006.01)

(52) U.S. Cl. .................. 438/133; 257/E21.35
(58) Field of Classification Search ............. 438/133; 257/E21.35, E21.388, E27.052
See application file for complete search history.

(56) References Cited

U.S. PATENT DOCUMENTS 6,462,359 B1 * 10/2002 Nemati et al. ............... 257/107

* cited by examiner

*Primary Examiner*—Scott B. Geyer
*Assistant Examiner*—Elias Ullah
(74) *Attorney, Agent, or Firm*—Fields IP, PS

(57) ABSTRACT

In one embodiment, a thyristor device may be formed in series relationship with a MOSFET. Alternating regions of opposite conductivity type may be formed in semiconductor material for defining source, body and drain regions for the MOSFET device, and in series relationship to the thyristor. A primary dopant for a commonly-shared cathode/anode-emitter and drain/source region may have a concentration that is at least one order of magnitude greater than that of any background dopant therein. In a particular embodiment, the thyristor device and the MOSFET in series relationship therewith collectively define part of a thyristor-based memory.

21 Claims, 3 Drawing Sheets

SEMICONDUCTOR DEVICE WITH A MOSFET FORMED IN CLOSE PROXIMITY TO A BIPOLAR DEVICE AND METHOD OF MANUFACTURE

BACKGROUND

The present disclosure is related to semiconductor devices and, more particularly, to the fabrication of thyristor-based semiconductor memory devices with MOSFETs in close proximity to bipolar devices.

When forming a MOSFET in close proximity to a bipolar device, as in the case of forming a thyristor-based memory device, the typical procedures for fabricating the MOSFET may degrade the characteristics of the bipolar device. In other words, implants specific to the formation of the MOSFET may adversely affect the qualities or characteristics of the bipolar device.

Typically, a given mask may protect thyristor regions during implants specific to the MOSFET device; and, likewise, another mask may be used to protect regions of the MOSFET during implants specific to the thyristor device. For large geometry devices, the lateral spacing between the body region for the MOSFET and the base region for the bipolar device may allow mask definition sufficient to protect an emitter region of the bipolar device during implants specific to the MOSFET and vice versa.

However, when forming the MOSFET and bipolar devices in close proximity for thyristor-based memory of increased circuit density and higher level of integration, the tolerance, limitations of typical known process procedures may limit the ability to protect against proximity effects. Process variations in combination with the limited masking resolution may impact the lateral penetration/placement of dopants within the semiconductor material, such that the typical procedures may not be well suited for realization of thyristor-based semiconductor memory devices of reduced geometries. When scaling the devices down for greater density, the bipolar device may eventually become more vulnerable to an adverse lateral influence of a MOSFET when formed in close proximity thereto using the typically known methods of fabrication. The increased vulnerability may further result in a greater variation in characteristic current gain for the bipolar device, which may become even more pronounced when forming mirror image devices.

For example, left and right thyristor memory devices to a mirror-image pair may become more sensitive to asymmetries associated with the individual processing steps that are employed during their fabrication as a result of the greater proximity of the MOSFETs to associated thyristors. The processes and/or patterning during definition of the left devices for the mirror-image pair will be opposite to the corresponding processes and/or patterning for definition of the right device. Hence for a given shift in patterning and/or processing, the effect may be doubled wherein the left devices may be affected in one way and the mirror image right device in the opposite way. This may lead to greater variation in characteristics from cell to cell.

As recognized by the present disclosure, the advancements for increased integrations with closer MOSFET and bipolar proximities may reach a certain threshold where typical procedures for fabricating thyristor-based memory devices, of commonly-shared emitter and drain/source regions, may no longer be viable for sustaining meaningful manufacturing yields and product reliability.

SUMMARY

In accordance with an embodiment of the invention, bipolar and MOSFET devices may be integrated together within semiconductor material by a method capable of overcoming proximity effects.

In an embodiment, alternating regions of opposite conductivity type may be formed in semiconductor material disposed over an insulator for defining source, body and drain regions for a MOSFET device. In addition, emitter and base regions for a bipolar device may be formed in the semiconductor material in series relationship with the MOSFET device. The drain/source region for the MOSFET device may be formed physically in common with the emitter region for the bipolar device. A primary dopant for the commonly-shared emitter and drain/source region may have a concentration that is at least one order of magnitude greater than that of any background dopant therein.

In a further embodiment, the ratio of primary dopant relative to the background dopant may be sustained through the thickness of the semiconductor material and within at least a partial width of the commonly-shared emitter and drain/source region. Further, the ratio may be sustained within the partial width sufficiently to enable realization of a gain characteristic for the bipolar device that may be substantially independent of the proximity of the MOSFET.

In a further embodiment, the MOSFET device may further comprise halo implants across a boundary of its body and drain/source region and the primary dopant to the commonly-shared emitter and drain/source region may comprise a conductivity type opposite to that of the halo implant.

In a further embodiment, the semiconductor material may comprise a layer of silicon with a thickness of about 100 nm over the insulator, and a lateral width of the commonly-shared emitter and drain/source region may be formed with a magnitude less than about 0.8 micrometers.

In a particular embodiment, the bipolar device may define part of a thyristor disposed in series relationship with the MOSFET. The thyristor and MOSFET may collectively define at least part of a thyristor-based memory.

BRIEF DESCRIPTION OF THE DRAWINGS

The subject matter of embodiments of the present invention may be understood by reference to the following detailed description, and with reference to the accompanying drawings, in which.

DETAILED DESCRIPTION

Figure 1:
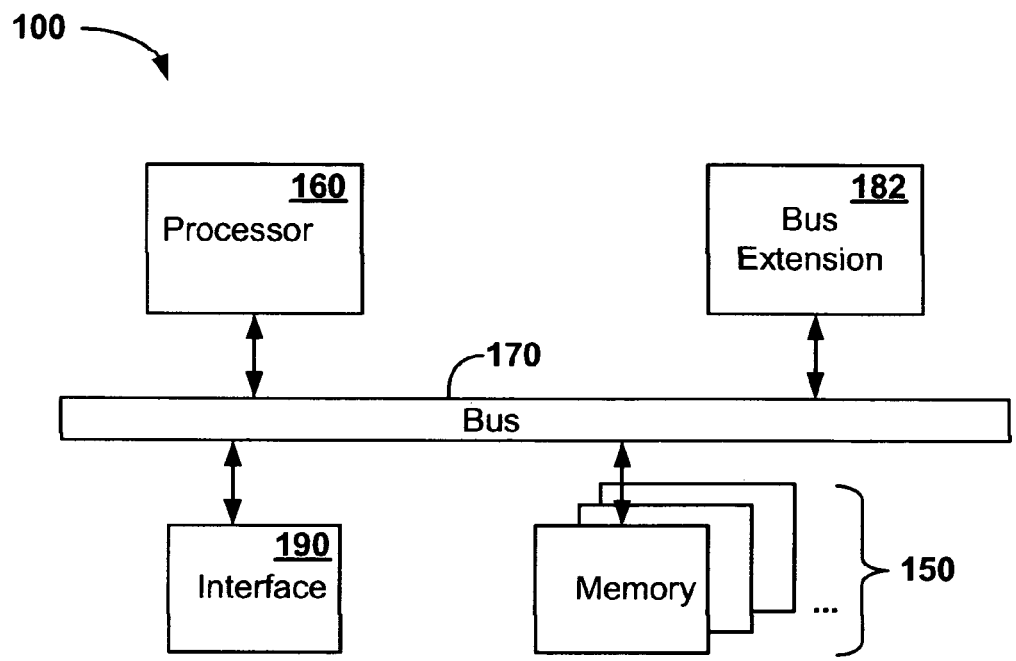
FIG. 1 is a functional block diagram showing a simplified computer memory system comprising processor, bus and memory arrays of transistor-based RAM ("TRAM") cells, as may be useful for gaining an understanding of some embodiments of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

In the further description that follows, readily established circuits and procedures for the exemplary embodiments may be disclosed in a simplified form (e.g., simplified block diagrams and/or simplified description) to avoid obscuring an understanding of the embodiments with excess detail and where persons of ordinary skill in this art can readily understand their structure and formation by way of the drawings and disclosure. For the same reason, identical components may be given the same reference numerals, regardless of whether they are shown in different embodiments of the invention.

As used herein, "substrate" or substrate assembly may be meant to include, e.g., a portion of a semiconductor or bulk material. Such portion may have one or more interfacing layers of material including, but not limited to Si, Ge, relaxed silicon germanium, and other semiconductors that may have been formed on or within the substrate. Layered semiconductors comprising the same or different semiconducting material such as Si/Si, Si/SiGe and SOI may also be included. These layers and/or additional layers may be patterned and/or may comprise dopants to produce devices (e.g., thyristors, transistors, capacitors, interconnects, etc.) for an integration of circuitry. In forming these devices, one or more of the layers may comprise topographies of various height. When referencing this integration of circuitry, therefore, it may be described as integrated together, on or with a substrate.

As referenced herein, portions of a semiconductor device (e.g., a transistor or thyristor) may be described as being formed in, at or on a semiconductor substrate. Such alternative terms in/at/on may be used individually merely for purposes of convenience. In the context of forming semiconductors, such terms may collectively reference portions of a semiconductor element that may be within and/or on a starting structure or material.

As used herein, the term "surface" may refer to the surface of an embedded layer or sheet of material. The "surface" may have one or more layers of materials over it, and might not, therefore, be exposed only to air or other non-semiconductor materials. The term surface may, thus, be used merely for clarity or convenience to describe layering of materials on each other (e.g., on the surface of the layer below the referenced layer). Further, "surface" or "upper surface" is not necessarily a "top surface" of a structure or device. For example, a substrate "surface" may interface with a layer of oxide, nitride, strained silicon, etc., and may be specified to merely establish a frame of reference for spatial relationships (e.g., vertical, horizontal, etc.).

As used herein, the terms "interface", "boundary", "border", "junction" or "extent" may, depending on context, be alternative terms and may be used individually merely for the purpose of convenience. For example, in discussing the junction of two layers, materials or structures, reference may be made to an "interface", "boundary", or "border".

Referencing FIG. 1, a computer system 100 may comprise a processor 160 with addressing capacity, memory management, and protection features that may enable it to process data associated with memory 150 or input/output interfacing devices 190 in the system. When read/write activities are being facilitated with memory 150, processor 160 may access memory locations to send or obtain addressed data or codes, using bus unit 170 which may assist in all memory and input/output reads and writes, prefetching instruction bytes, and controlling transfer of data to and from extension devices 182. Memory 150 may store the binary codes for the sequences of instructions to be executed by computer system 100 or the binary-coded data with which computer system 100 may work.

As may be consistent with certain embodiments of the present invention, memory 150 may comprise arrays of thyristor-based random access memory (TRAM) cells that may be built in a semiconductor substrate structure. For example, referencing FIG. 2 in accordance with certain embodiments, such thyristor-based memory cell 200 may comprise an N-P-N-P structured thyristor 204 and a MOSFET access device 202 integrated together in a layer of silicon 226 disposed over buried oxide 228 and over supporting substrate 238 of, e.g., silicon-on-insulator (SOI) structure.

Figure 2:
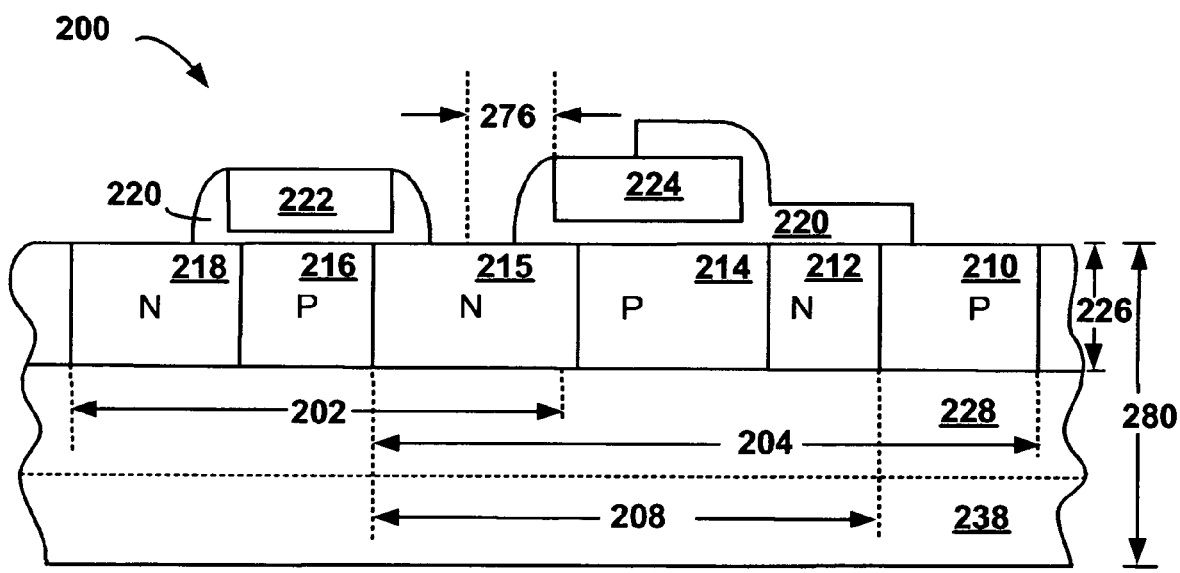
FIG. 2 is a simplified cross-sectional view of a TRAM cell comprising a thyristor in proximity of a MOSFET device in a silicon-on-insulator (SOI) substrate, showing an emitter region in common with one source/drain region being vulnerable to MOSFET specific implants.

Further referencing FIG. 2, the N-P-N-P doped regions 215, 214, 212, 210 formed in silicon 226 may define respective cathode-emitter, p-base, n-base, and anode-emitter regions for thyristor 204. A capacitive electrode 224 may be disposed at least in part over p-base region 214 between the anode-emitter and cathode-emitter regions 210, 215. As referenced subsequently herein, capacitive electrode 224 may be described as a second wordline electrode in memory applications, which may be used to assist operation of thyristor 204. For example, when writing a logical zero to cell 200 during write operations, it may be biased to influence movement of charge in the p-base relative to cathode-emitter region 215.

For more readily understanding certain embodiments of the present invention, further referencing FIG. 2, N-P-N-P doped regions 215, 214, 212, 210 for thyristor may be understood as forming an NPN bipolar device 208 cross coupled (base-to-collector and collector-to-base) to a PNP bipolar device. In a particular embodiment, the cathode-emitter region for the thyristor may be physically in common with a drain/source region for the neighboring MOSFET 202 and may be described as establishing a commonly-shared emitter and drain/source region.

Continuing with reference to FIG. 2, gate electrode 222 may be disposed over body region 216 and may be operable under bias to affect an electric field in the body region, wherein a conductive channel may be formed between the source and drain regions for enabling selective access of thyristor 204. As referenced subsequently herein, gate electrode 222 may be described as a first wordline electrode in memory applications.

When forming the thyristor memory device, dielectric 220 may be layered conformally over a surface of silicon 226 as well as wordline electrodes 222, 224. It may then be etched anisotropically to define spacers against the sidewalls of the first wordline electrode and against a sidewall of second wordline 224 that faces the first wordline. The etching, via an etch mask not shown, may further define a portion of the dielectric conformal over a shoulder of the second wordline, against the sidewall of the second wordline opposite the first electrode, and over a region of silicon 226 that extends laterally outward therefrom.

In some cases, before the formation of the spacers from dielectric 220 as described above, n-type ions (such as phosphorus) may be implanted to form extension regions in the silicon laterally about the gate electrode 222. These extension regions may be referenced as lightly doped drain (LDD). The formation of extension regions 218, 215 may help to control so called short-channel effects or punch-through issues.

It may be noted, therefore, that the spacers defined by patterned dielectric 220 against the MOSFET gate may serve to define a length or lateral extent for the extension regions, wherein a subsequent self-aligned implant of n-type dopant may define source/drain regions.

Additionally, halo implants may also be provided proximate the boundary defined between the drain/source region and body region near the lower regions of the silicon layer. Typically, when performing these halo-implants, portions of the commonly-shared region 215 proximate the thyristor base region 114 may be masked.

As recognized herein, variation in dopant through the depth of the silicon may result in non-homogeneity in the commonly-shared emitter and drain/source region. When serving as an emitter to thyristor 204, the non-homogeneous dopant profile in the commonly-shared emitter and drain/source region may directly influence a concentration ratio of the cathode-emitter region 215 relative to p-base region 214 and, thus, affect the gain characteristic to be associated with the bipolar device 208. It may also be theorized that the variation in dopant through the emitter region, as may be caused by close proximity of the MOSFET, could make the performance of the bipolar device more sensitive to process variations. For example, different resulting gain might thus be imparted to left versus right thyristor devices of a mirror image pair, which difference in resulting gain could result from asymmetry during respective left versus right processing procedures. Such affects of the typical procedures for fabrication could adversely impact the overall resulting performance and/or yield of product, such as, for example, TRAM memory arrays.

Non-homogeneity in region 215 to a typical device may occur when n-type dopant is implanted to dope the top level of the region with a low implant energy level, e.g., 5 keV, so as to distribute the n-type dopant for the extension region more heavily near the upper surface than within the lower levels of the silicon. Further, area 234 may also be affected by residual p-type ions of the halo-implant across the boundary defined between body region 216 and drain/source regions 215. Because of the resulting doping variation and lower concentration in the bottom level, an "impaired area" 234 may then appear near the body region 216 of the MOSFET and in the lower elevations of the layer of silicon over the insulator.

Because the typical doping procedures for the formation of drain/source regions for the MOSFET may differ from the typical doping procedures for the emitter region for the bipolar device (i.e., of the thyristor), it may be apparent that the bipolar device may become vulnerable to the "impaired" effects of region 234 when formed in close proximity to the MOSFET.

This phenomenon, or vulnerability, may be called a "proximity effect," and may be understood to have the potential of influencing the base current, collector current and gain of NPN device 208. However, it may be further noted that such change in the magnitude of base current may not necessarily be observed until the magnitude of the lateral space 276 (which may be defined as about one half of a lateral distance between wordline electrodes 222, 224) drops below a given threshold. For example, the proximity effects may not be significant for device realizations with an interspacing of at least about 1.4 micrometers, wherein the proximity effect may be described as negligible. However, when the magnitude of separation 276 is shortened to a certain threshold, e.g., to 0.8 micrometers, the proximity effects caused by the close proximity of the MOSFET may become more influential. When this occurs, area 234 of the impaired concentration may be viewed as reducing the effective concentration of primary dopant near the bottom of the emitter region and thus theorized to facilitate an increase in back-injection current from p-base region 214 and reduction in current gain of bipolar device 208.

Novel yet practicable methods consistent with certain embodiments of the present invention may be employed to address some of these proximity effects.

Figure 5:
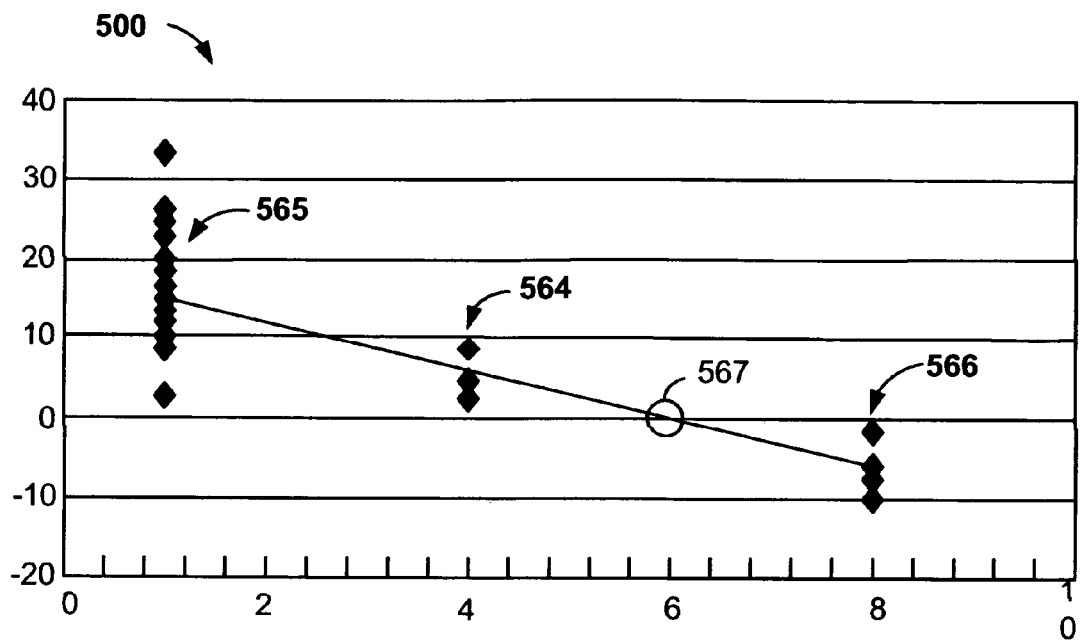
FIG. 5 is a computer generated graph showing the effect of additional implant in the thyristor, measured as percentage difference between two magnitudes of the base current corresponding to two different distances between the thyristor and the MOSFET.

Skipping forward with reference to FIG. 5, graph 500 illustrates the vulnerability of typical thyristor-based memory devices to proximity effects relative to those having characteristics consistent with embodiments of the present invention. The left axis may be used to quantify, as a metric, differences in operative base current to sustain a conductive state for thyristor-based memory cells of small lateral spacing (e.g., 0.8 µm) between the thyristor and MOSFET devices relative to realizations of large lateral spacing (e.g., 1.4 µm). This change in operative base current for the close proximity realizations relative to the more distant realizations may be described (in percentage ratio) as the proximity effect.

The horizontal axis, on the other hand, may characterize an implant dosage during an implant for an emitter region of a bipolar device relative to the typical implant dosage. For realizations fabricated by typical procedures, the normalized dosage may be represented by a magnitude of one. For realizations formed consistent with embodiments of the present invention, the normalized dosage relative to the typical dosage may establish a magnitude greater than one—e.g., four times the typical dosage or eight times the typical dosage.

Further referencing FIG. 5, thyristor-based memory devices formed by the typical procedures may be characterized by data points 565 extending vertically along the normalize dosage level of one. It may be noted that the proximity effect can be observed with magnitudes around an average level of about 15% for the observed changes in operative base current to bipolar devices of close versus far proximity realization thyristor memory.

Further referencing FIG. 5, in one embodiment of the present invention, the dosage during implant of the common emitter and drain/source region to the thyristor-based memory device may be performed using a dosage that is up to about four times that of the typical dosage. For example, the implant may use dopant of phosphorous with a dosage of about $2 \times 10^{14}$ atoms/cm$^2$ and implant energy of about 20 keV into silicon of thickness of as little as about 100 nanometers. By using this increased level of dosage, in accordance with this embodiment, the proximity effect as represented by data points 564 may be reduced to a level of only about 5%.

In another experimental run for fabrication of thyristor memory devices consistent with a further embodiment of the present invention, the dosage for the implant of the common emitter and drain source region to the thyristor memory cell may be increased to a level of up to about eight times that of the typical process, e.g., $4 \times 10^{14}$ atoms/cm$^2$. As represented by the experimental results 566 in graph 500, the observed proximity effect shows an inversion. At this increased level of dopant concentration, the device realization of close proximity may be characterized with a smaller operative base current than the realization of large lateral distance. But still, this experimental result for the increased dosage revealed a percent change of only 5%, which is much less than the 15% proximity effect observed for the typical realizations.

Further referencing curve 500 of FIG. 5, an extrapolation of the curve to zone 567 as might be predicted for realization of devices for proximity effects of approximately zero; one may theorize a doping level of about six times the typical dosage for some embodiments of the present invention. Accordingly, the thyristor-based memory cells might be theorized to have a minimum sensitivity to process variations during fabrication and be capable of production with good yield. Further, the devices may be theorized to show good uniformity in operative base currents across a given memory array. Further, it may be theorized that the sensitivities may be small for potential asymmetries associated with production of left-right mirror-imaged devices when formed using a dosage level for the commonly-shared drain/source and cathode-emitter region as represented by zone 567 where curve 500 crosses the region of about zero proximity effect.

In a particular embodiment, turning back with reference to FIG. 3, photoresist 330 may be layered over substrate 280 with wordlines 222, 224 and patterned dielectric 220. The photoresist 330 may be patterned to define an opening and to expose a portion of region 215 of silicon 226 laterally between electrodes 222, 224. N-type dopant 306 may then be implanted through the opening defined in the patterned mask, into the exposed portions of silicon to define the commonly-shared emitter and drain/source region. In this embodiment, this implant may be performed with energy sufficient to penetrate the full depth of silicon 226, and with dosage sufficient to establish a concentration of primary dopant (n-type) in the emitter region 215 that is at least one order of magnitude greater than that of any background dopants therein. In one example, the implant may be performed using dopant of phosphorous with dosage of about $3 \times 10^{14}$ atoms/cm$^2$ and implant energy of about 15 keV.

Figure 3:
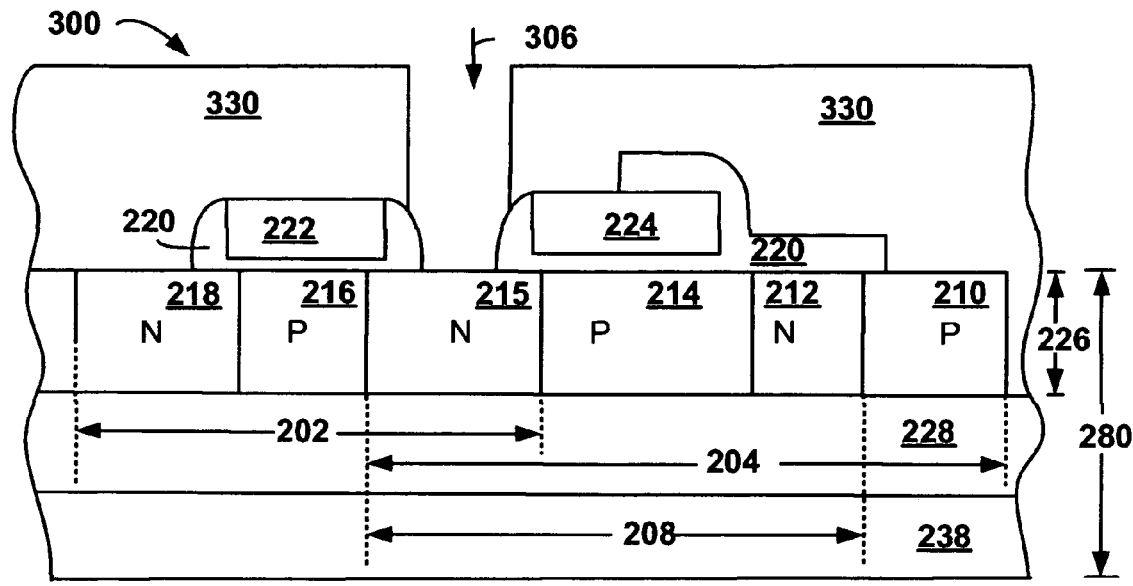
FIG. 3 is a simplified cross-sectional view of the TRAM cell of FIG. 2, as may be associated with certain embodiments of the present invention, showing the implant to form the commonly-shared emitter and drain/source region with a concentration relative to that of the base region.

Continuing with reference to FIG. 3, it may be understood that the length and doping provisions for the formation of emitter and base regions 215, 214 may affect the operating characteristics of the associated thyristor/bipolar device. For example, the blocking threshold voltage $V_{FB}$ for thyristor 204 and the holding current $I_H$ required for an on-state condition may depend on the current gain of the component bipolar devices, which in turn may depend on the length and doping densities of base region 214 relative adjoining emitter region 215. The integrated amount of the dopant provided for a base region along the base length relative to the integrated amount of the dopant provided for emitter region 215 along the emitter length may be understood, generally, to establish the current gain to bipolar device 208. Accordingly, designs for establishing a given gain for bipolar device 208 may target certain ratios of the integrated base doping relative to the integrated emitter doping (known as base and emitter Gummel numbers respectively). The design selections for these base and emitter dopant properties may be guided by principles of known Gummel number relationships and equations available from bipolar transistor theory. In general, a device designed with a short base and/or light base doping may achieve a high gain (beta).

Relative to the emitter region, in accordance with embodiments of the present invention, the implant energy and dosage may be selected to establish a primary dopant density therein sufficient to achieve a desired current gain while overcoming secondary influences of background dopants upon the bipolar gain, which background dopants may include, for example, the halo implants and other residual source/drain dopant profile effects that may be associated with forming the neighboring MOSFET device 202.

In a particular embodiment of the present invention, implantation of dopant 306 for the emitter region may be realized with a dosage of, e.g., at least six times greater than that used for typical source/drain implant and of an implant energy sufficient to extend dopant 306 through the depth of the silicon. For example, dopant 306 of phosphorous may be implanted using a dosage of about $1-7 \times 10^{15}$ atoms/cm$^2$ and an implant energy up to about, e.g., 15 keV.

In a further embodiment, the implant of dopants for the common emitter and drain/source region 215 may use an energy less than that of the embodiment described above, whereas an anneal procedure may then be used to extend the dopant more uniformly through the depth of the layer of silicon.

For example, dopant of phosphorous may be implanted with dosage of at least about $3 \times 10^{14}$ atoms/cm$^2$ and with an implant energy of about 5 keV. A subsequent anneal may then be performed using a temperature of at least about 1000 degrees C. for a duration of at least about 10 seconds. This may be understood to assist diffusion of the n-type dopant through the depth (e.g., 100 nm) of the layer of silicon.

For the embodiments described above relative to FIG. 3, gate electrode 222 for the MOSFET may be assumed of a relatively wide width over a long channel region between the source and drain regions. It may be understood, therefore, that such MOSFET device of long-channel length may be operable without real concern for certain short-channel effects. On the other hand, when MOSFET 202 is realized with a relatively narrow width gate electrode 222 (e.g., less than 0.20 µm) so as to define a short-channel length between the source and drain regions, then the doping of the drain portion to the commonly-shared emitter and drain/source region 215 may need to be tailored more carefully for reduced concentration into the depth of the silicon. Accordingly, the concentration of n-type dopant for the portion 234 of the drain/source region 215 proximate insulator may be substantially less than that near the upper surface; wherein MOSFET 202 might then be operable absent short-channel effects. Halo implants might also be provided to further alleviate the potential for short-channel effects.

Figure 4:
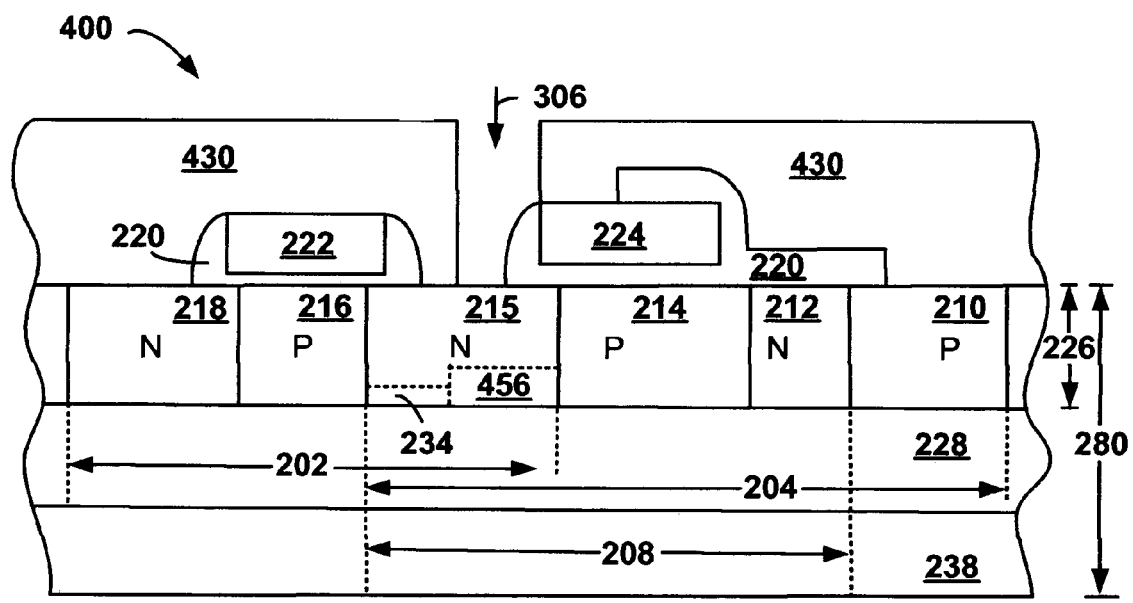
FIG. 4 is a simplified cross-sectional view of the TRAM cell of FIG. 3, consistent with a particular embodiment, showing the formation of the commonly-shared emitter and drain/source region with an additional implant in the emitter region.

For some such examples, therefore, in accordance with another embodiment of the present invention and with reference to FIG. 4, an augmentation implant 306 may be performed to augment dopant concentration in the emitter portions of the commonly-shared emitter and drain/source region 215. For example, photoresist may be patterned over the substrate 280 (including electrodes 224, 222 and patterned dielectric 220) to define an opening for exposing an emitter portion of the commonly-shared region 215. The emitter portion may be defined more proximate the base region for the bipolar device as opposed to the body region for the MOSFET. In a particular example, the mask window for this augmentation implant may be defined in part by the spacer of dielectric 220 against the sidewall of capacitor electrode 224.

After defining the augmentation mask for protecting the MOSFET regions, additional primary dopant (n-type) may be implanted into the emitter portion of the commonly-shared emitter and drain/source region 215. The augmentation implant may be performed with dosage and implant energy sufficient to overcome or compensate for potential proximity effects that could be imparted to the bipolar device by impaired area 234, as may be associated with the MOSFET device. In other words, the augmentation implant may be described as neutralizing potential proximity effects of the MOSFET device that might otherwise influence operation of the bipolar device.

The augmented area 456 may be further theorized to block back injected base current to the neighboring p-base region 214 which, in turn, may assist the emitter injection efficiency to sustain a target current gain of bipolar device 208.

Consistent with one embodiment, the additional augmentation implant 306 of dopant may be performed with a dosage determined appropriate to sustain a base current and gain characteristics to NPN device 208 independent of the proximity of MOSFET device 202. For this particular embodiment, further referencing FIG. 5, the potential proximity effect for a bipolar device in proximity to a neighboring MOSFET device may be quantified by the percentage of variation in base current between realizations therefor of various interspacing 276. In some cases, the dosage amount may be determined with the assistance of computer-generated simulation. Further referencing FIG. 5, proximity effects may be observed to decline as the dose of dopant 306 increases. Further, it may be observed to change from positive (indicator 564) to negative (indicator 566). Accordingly, a dosage may be selected, e.g., six times a typical source/drain implant, by which to target a resultant proximity effect of about zero. For example, referencing FIGS. 4 and 5, dopant of phosphorous may be implanted with dosage of at least about $1-7\times10^{15}$ atoms/cm$^2$ into exposed silicon of about 100 nm thickness using an implant energy of at least about 15 keV.

Figure 6:
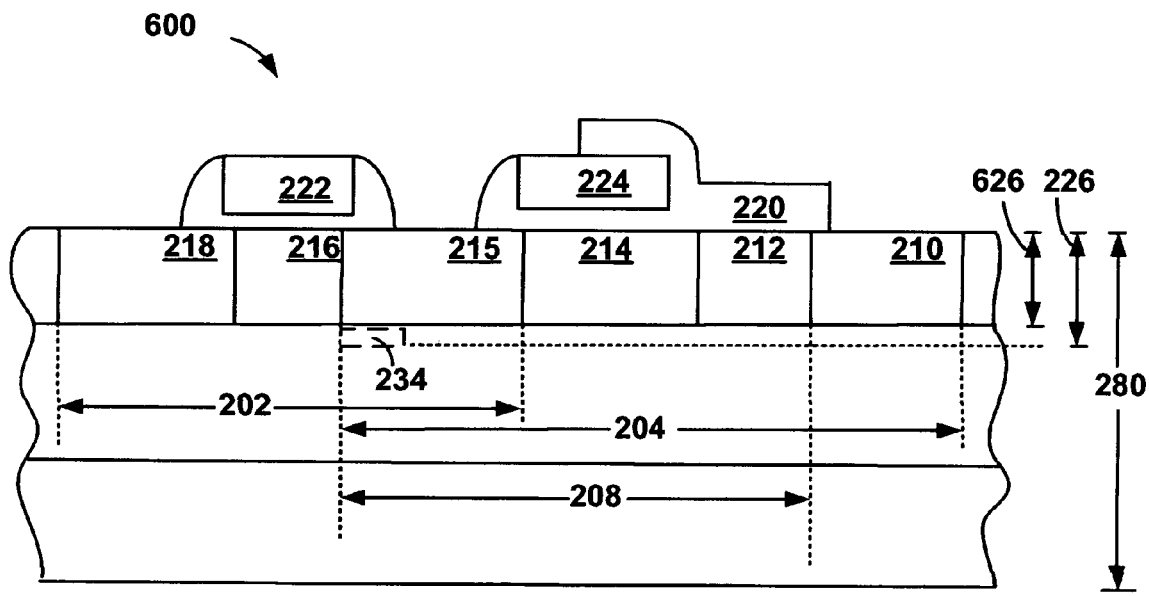
FIG. 6 is a simplified cross-sectional view of a TRAM cell comprising a thinner layer of silicon that may eliminate the impaired area in the commonly-shared emitter and source/drain region, consistent with another particular embodiment of the present invention.

In yet another embodiment, referencing FIG. 6 relative to FIG. 2, an alternative method of eliminating the proximity effect may comprise determining a thickness for silicon layer 626 sufficiently thin to effectively place the affected source/drain region, i.e., impaired area 234, outside the silicon depth for commonly-shared emitter and drain/source region 215. The layer of silicon may be formed with a thickness up to the predetermined thickness. In one such embodiment, silicon layer 626 over insulator 228 may be formed (e.g., epitaxially using heteroepitaxy, psuedomorphic growth, molecular beam epitaxy, ultrahigh-vacuum chemical vapor deposition, and the like) for a thickness therefor of less than 85 nanometers. Such thickness may be, e.g., as much as 15 percent thinner than that for the layer of silicon of the previously described embodiments.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments. It may be further understood that such modifications and changes might not depart from the true spirit and scope of the present invention as may be set forth in the following claims.

What is claimed is:

1. A method of fabricating a thyristor-based semiconductor device comprising:
   forming alternating regions of opposite conductivity type in a layer of semiconductor material over an insulator and defining source, body, and drain regions for a MOSFET device and emitter and base regions for a thyristor device in series relationship;
   forming the alternating regions to define one of the source and the drain regions for the MOSFET in physical common relationship with the cathode/anode-emitter region to the thyristor;
   forming the drain/source region in common with the cathode/anode-emitter region by:
      implanting primary dopant with dosage sufficient to establish a concentration therefore in the emitter region of at least one order of magnitude greater than that of background dopant; and
      performing the implanting of the primary dopant for the emitter region to penetrate a full depth of the semiconductor material.

2. The method of claim 1, further comprising:
   determining a ratio of the primary dopant in the cathode/anode emitter region relative to background dopant sufficient to enable a gain realization for the bipolar device substantially independent of a proximity of the MOSFET; and
   using a dosage and an implant energy for the implant of the primary dopant to form the emitter region with the ratio determined.

3. The method of claim 1, further comprising:
   determining a depth for the semiconductor material sufficiently thin to enable the formation of the concentration of primary dopant therethrough for the emitter region;
   forming the semiconductor material over the insulator with a thickness up to the depth determined for enabling the formation of the bipolar device with a gain realization substantially independent of a proximity of the MOSFET.

4. The method of claim 3, further comprising forming silicon for the semiconductor material over the insulator with a thickness of up to about 100 nanometers.

5. The method of claim 4, the emitter and base regions formed for defining the thyristor in electrical series relationship with the source, body and drain regions for the MOSFET.

6. The method of claim 5, in which the forming the silicon over the insulator comprises doping the silicon with p-type dopant; and
   the forming the source and drain regions for the MOSFET and the cathode-emitter of the thyristor in common with the one of the drain/source regions comprises:
      defining openings in a mask to expose regions of the layer of silicon for the source, drain and emitter regions;
      using the n-type dopant as the primary dopant; and
      performing the implant of the n-type dopant using a dosage of at least about $3\times10^{14}$ atoms/cm$^2$ and energy sufficient to penetrate the full depth of the exposed regions of the silicon layer as defined by the mask.

7. The method of claim 6, in which the implanting uses an implant energy of at least 15 keV.

8. The method of claim 7, further comprising:
forming a first electrode over the body region for the MOSFET; and
forming a second electrode over the base region for the thyristor; and
defining a window of the mask in part with at least one of the first and the second electrodes;
the implanting of n-type dopant for the commonly-shared drain/source and cathode-emitter region to direct the n-type dopant to exposed portions of the layer of silicon laterally between the first and second electrodes as defined by the window of the mask.

9. The method of claim 8, in which the first and the second electrodes are formed over the layer of silicon to define a lateral distance therebetween of less than about 0.8 μm.

10. The method of claim 9, in which the silicon layer is formed epitaxially.

11. The method of claim 10, in which the p-type dopant for the silicon layer is diffused into the silicon for a concentration up to about $3 \times 10^{16}$ atoms/cm$^3$.

12. The method of claim 11, in which the forming the n-type region in the silicon layer to define the commonly-shared emitter and drain/source region comprises implanting n-type dopant with a dosage of at least about $3 \times 10^{14}$ atoms/cm$^2$.

13. The method of claim 12, in which the commonly-shared emitter and drain/source region is formed with a density of n-type dopant of at least about $3 \times 10^{16}$ atoms/cm$^3$.

14. The method of claim 1 in which the implanting the primary dopant establishes a doping concentration therefore in the commonly-shared emitter and drain/source region of at least about $5 \times 10^{17}$ atoms/cm$^3$.

15. The method of claim 14, further comprising performing a directional halo-implant across a boundary defined between the body region and the drain/source region in the silicon layer.

16. The method of claim 15, in which the implanting the primary dopant to define the drain/source region uses an implant energy sufficient to penetrate the full depth of the silicon with the primary dopant.

17. The method of claim 16, in which the implanting the primary dopant uses an implant energy of at least about 15 keV.

18. The method of claim 17, in which the forming the alternating regions of opposite conductivity type defines the cathode-emitter, p-base, n-base, and anode-emitter regions for the thyristor and the source, body, and drain regions for the MOSFET.

19. The method of claim 18, in which the implanting the primary dopant comprises implanting n-type dopant to define the cathode-emitter region for the thyristor in common with the drain/source region for the MOSFET.

20. The method of claim 19, in which the implanting the n-type dopant to define the cathode-emitter region in common with the drain/source region penetrates the full depth of the silicon layer with dosage sufficient to compensate residual halo implants within a portion of the cathode-emitter region proximate the insulator.

21. The method of claim 20, in which the n-type dopant is implanted to define the cathode-emitter region penetrates the portion of the cathode-emitter region proximate the neighboring p-base region for the thyristor.

* * * * *